United States Patent [19]
Thiele et al.

[11] 4,090,233
[45] May 16, 1978

[54] SPATIAL ARRANGEMENT OF THE VALVES OF A THREE-PULSE CONVERTER SYSTEM

[75] Inventors: Gerd Thiele; Manfred Schraudolph, both of Erlangen, Germany

[73] Assignee: Siemens Aktiengesellschaft, Munich, Germany

[21] Appl. No.: 711,888

[22] Filed: Aug. 5, 1976

[30] Foreign Application Priority Data

Aug. 25, 1975 Germany .............................. 2537780

[51] Int. Cl.² .............................................. H02M 7/00
[52] U.S. Cl. ...................................... 363/68; 363/144
[58] Field of Search ............... 321/8 R, 8 C, 26, 27 R; 363/65, 67, 68, 69, 70, 144

[56] References Cited

U.S. PATENT DOCUMENTS

| B 432,424 | 1/1975 | Keyl et al. | 321/8 C |
|---|---|---|---|
| 3,629,687 | 12/1971 | Hessen | 321/27 R |
| 3,684,943 | 8/1972 | Demarest | 321/27 R |
| 3,913,003 | 10/1975 | Felkel | 321/27 R |

OTHER PUBLICATIONS

Electrical Review, vol. 191, No. 9, pp. 306–308, Sep. 1972.
(S 3082 0071), Brown Boveri Rev. 2/3 (73), vol. 60, pp. 100–107.
(I 202-7503-A), IEEE Transactions on Industrie Applications, vol. 1A-11, No. 3, pp. 263–266, May/Jun. 1975.

Primary Examiner—William M. Shoop
Attorney, Agent, or Firm—Kenyon & Kenyon, Reilly, Carr & Chapin

[57] ABSTRACT

A twelve pulse converter system is disclosed in which the two three-phase converter bridges forming the system are arranged one on top of the other in a single tower-like assembly and the valves of the bridges are disposed successively and separately as to phase. Additionally, the DC and AC terminals of one of the converter bridges are disposed on the one side of the tower-like assembly and the DC and AC terminals of the other of the converter bridges are disposed on the other side of the tower-like assembly, the DC terminals located on opposite sides being connected to each other by a DC lead.

3 Claims, 4 Drawing Figures

SPATIAL ARRANGEMENT OF THE VALVES OF A THREE-PULSE CONVERTER SYSTEM

BACKGROUND OF THE INVENTION

1. Field of the Invention

The invention relates to a twelve-pulse converter system in which two three-phase converter bridges are adapted to be connected to respective converter transformers, are connected in series on their DC sides and include bridge sections, several of whose valves are arranged one on top of the other in tower-like fashion.

2. Description of the Prior Art

A prior art twelve-pulse converter system comprises two three-phase converter bridges, one of which is connected to a Y-connected transformer and the other of which is connected to a delta-connected transformer. The converter bridges are connected on their DC sides in series and each converter bridge includes separately mounted valves for the individual converter phases. More particularly, the four converter valves of the two bridges associated with each given phase are arranged one on top of the other with the two converter valves associated with one bridge arranged at the bottom and connected to one of the above-mentioned transformers and the two converter valves associated with the other bridge disposed at the top and connected to the other of the above-mentioned transformers.

The aforesaid prior art converter has various disadvantages. Because the valves associated with different phases are arranged in separate towers, a large base area is required. In addition, appropriate safety distances must be maintained between the individual valve towers and the housing in which the valve towers are arranged. This means that the housing must be made relatively large. Furthermore, since each valve tower must be connected to both transformers, the AC leads connecting the transformers to the valve towers must cross in two planes on top of each other. This requires a considerable amount of apparatus for the disposition of the leads.

It is an object of the present invention to provide an improved twelve-pulse converter system which requires a minimum of base area, a relatively small housing and, furthermore, includes a simple arrangement for the leads coupling the converter valves to the transformers.

SUMMARY OF THE INVENTION

In accordance with the principles of the present invention, the above and other objectives are accomplished in a converter system of the above type by arranging the converter bridges in a single tower-like assembly, and, further, by disposing the valves of each converter bridge successively and separately as to phase. Additionally, the DC and AC terminals of the one converter bridge are disposed on the one side of the tower-like assembly and the DC and AC terminals of the other converter bridge on the other side of the tower-like assembly, the DC terminals located on opposite sides being connected to each other by a DC lead.

With the above-described arrangement of the converter system, only a small base area is required, since the lateral voltage safety spacing otherwise required between the individual valve towers is no longer necessary. Also, the height of the assembly need not be increased, or only insignificantly so. Because the two transformers are now connected to the converter bridges on opposite sides of the tower-like assembly, a simple lead arrangement is realized. In particular, if the transformers are mounted side by side on the outside of a building, the leads can be brought to the converter bridges in almost straight lines.

In a further embodiment of the invention, each valve is designed so as to extend over only one story or level of the tower-like assembly. This results in a low valve tower. Moreover, in such case the DC lead may be extended across the middle of the tower-like assembly.

BRIEF DESCRIPTION OF THE DRAWINGS

The above and other features and aspects of the present invention will become apparent upon reading the following detailed description in conjunction with the accompanying drawings, in which.

DETAILED DESCRIPTION

Figures 1, 2:
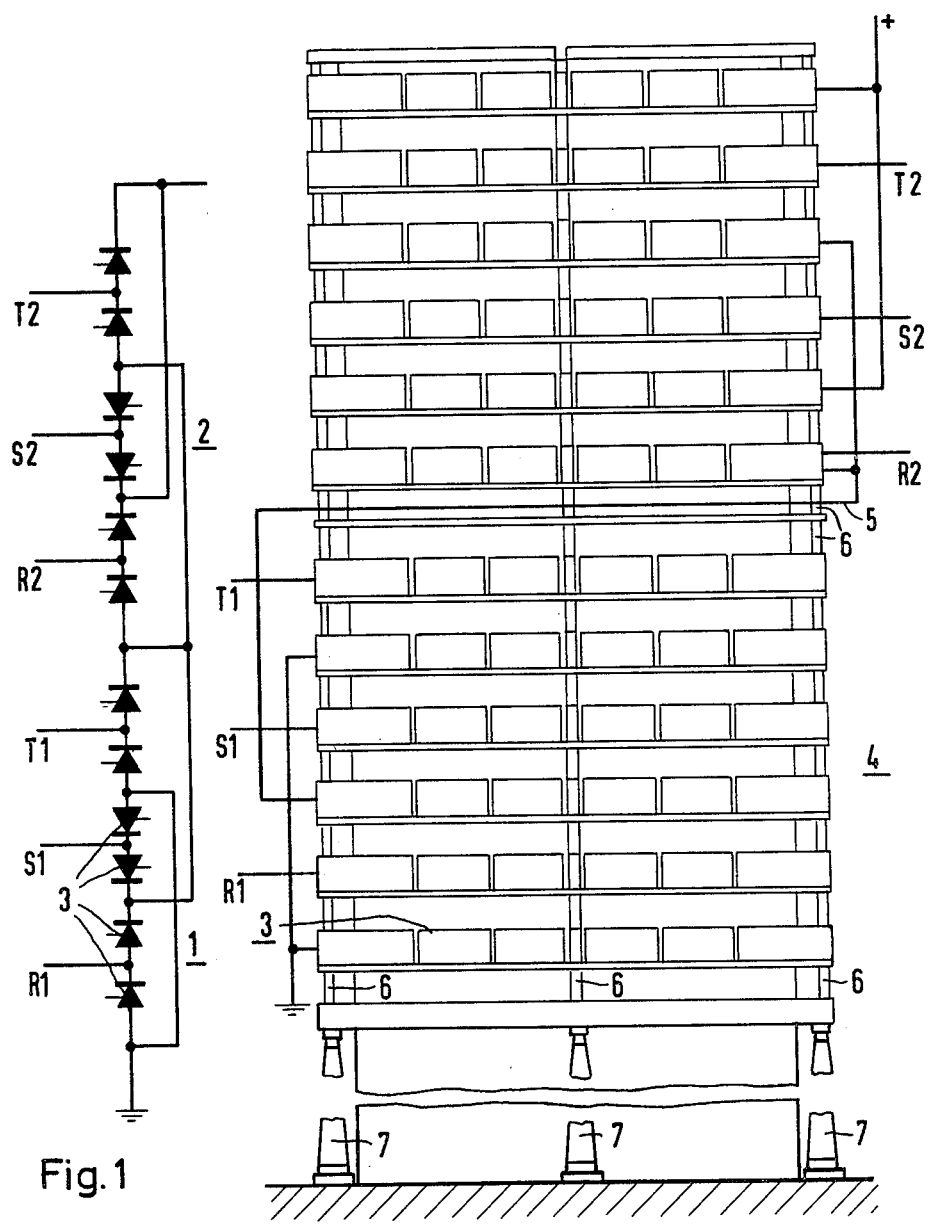
FIG. 1 shows in schematic fashion a circuit diagram of a converter system in accordance with the principles of the present invention.
FIG. 2 shows a view along the long side of the converter system assembly whose electrical schematic is shown in FIG. 1.

FIG. 1 shows an electrical circuit diagram of a converter system in accordance with the principles of the present invention. The converter system includes two converter bridges 1 and 2 connected in series and arranged one on top of the other to form a single tower-like assembly. The AC terminals of the converter bridge 1 are designated as R1, S1 and T1, and the AC terminals of the converter bridge 2 as R2, S2 and T2. The converter bridges 1 and 2 each include valves 3 arranged successively and separately as to phase. As can be seen from the diagram, the direction of rotation for the valves of the individual phases is reversed so that a minimum number of connections are needed for coupling the DC sides of the bridges. As shown, each valve is symbolized by a single thyristor. However, as is well known, each such valve in actual practice is formed from a multiplicity of series-connected thyristors or other semiconductor valves.

Figure 3:
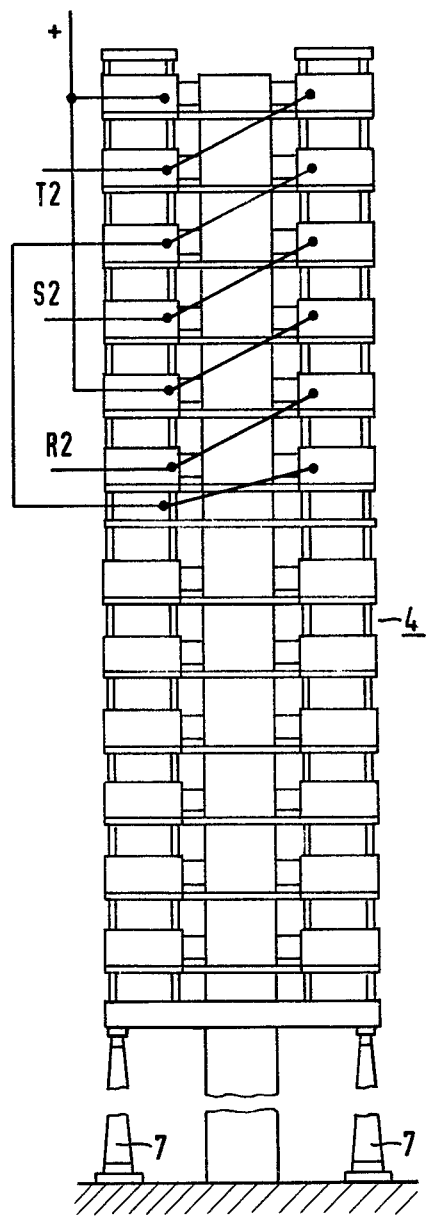
FIG. 3 illustrates a view of the right end face of the converter assembly of FIG. 2.
Figure 4:
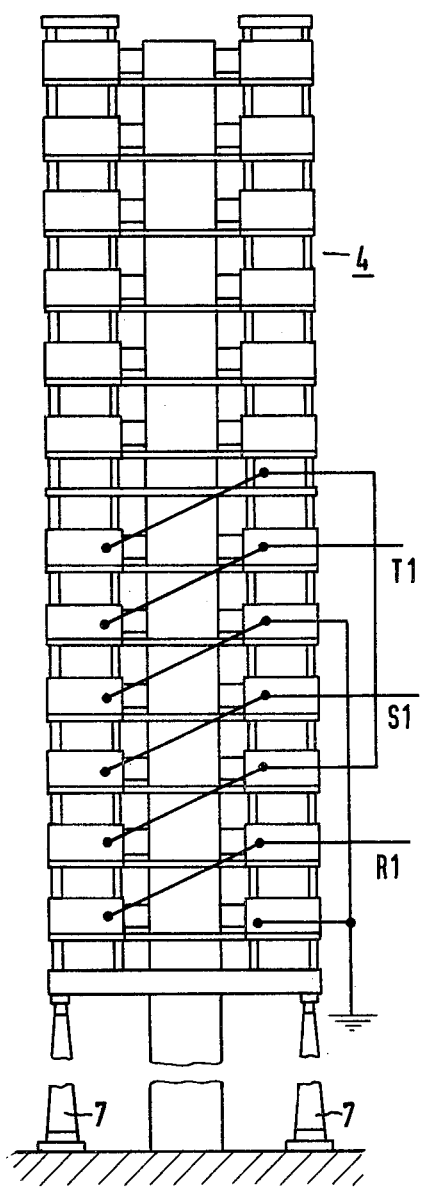
FIG. 4 shows a view of the left end face of the converter system assembly of FIG. 2.

FIGS. 2 to 4 show the physical structure of the converter system of FIG. 1. In the embodiment shown, each valve 3 includes multiplicity of thyristors or other semiconductor valves arranged in one story or level of a valve tower 4. The AC terminals R1, S1, T1 and R2, S2, T2, respectively, are again shown schematically, as are the interconnections of the DC terminals. In the middle of the valve tower 4, a DC line 5 extends from one side to the other for connecting the DC terminals of the bridges. FIGS. 3 and 4 show how the electrical connections are brought from one story or level to another on the end faces of the valve tower 4. FIG. 2, moreover, shows that the AC terminals R1, S1 and T1 are located on the one side of the valve tower 4, and the AC terminals R2, S2 and T2 on the other side of the valve tower. This permits a simple and nearly straight line coupling of the leads to the respective transformer (not shown) feeding the bridges 1 and 2.

Each succeeding level of the valve tower 4 is supported on the respective preceding level via pin insulators 6. The overall valve tower, in turn, rests on the main support insulators 7. To permit the DC line 5 to extend through the middle of the valve tower 4, either longer pin insulators may be inserted between the stories immediately above and below such middle or, as shown, two ordinary pin insulators, such as are used for supporting the stories, may be placed one on top of the other.

Arranging all valves of the converter system in a single valve tower has the further advantage that an appropriate insulation path for the valves arranged at higher potential is built up automatically.

What is claimed is:

1. An arrangement comprising:

first and second three phase converter bridges adapted to be connected to respective converter transformers the first bridge including valves which are arranged successively and separately as to phase and all of which are further arranged so as to lie one on top of the other to form a first tower-like structure;

the second bridge including valves arranged successively and separately as to phase and all of which are further arranged so as to lie one on top of the other to form a second tower-like structure;

the first tower-like structure being arranged on top of the second tower-like structure to form a single tower-like assembly;

the first bridge having DC and AC terminals arranged on one side of said assembly;

the second bridge having DC and AC terminals arranged on the other side of said assembly; and a DC line connecting the DC terminals of said first and second bridges.

2. An arrangement in accordance with claim 1 in which:

each valve of each bridge forms one story of said assembly.

3. An arrangement in accordance with claim 1 in which:

said DC line extends across the middle of said assembly.

* * * * *